(12) United States Patent
Um et al.

(10) Patent No.: US 10,139,685 B2
(45) Date of Patent: Nov. 27, 2018

(54) ARRAY SUBSTRATE, MANUFACTURING METHOD THEREOF AND DISPLAY DEVICE

(71) Applicant: BOE TECHNOLOGY GROUP CO., LTD., Beijing (CN)

(72) Inventors: Yoon Sung Um, Beijing (CN); Yun Sik Im, Beijing (CN); Hyun Sic Choi, Beijing (CN); Hui Li, Beijing (CN); Yunyun Tian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/306,879

(22) PCT Filed: Apr. 12, 2016

(86) PCT No.: PCT/CN2016/079035
§ 371 (c)(1),
(2) Date: Oct. 26, 2016

(87) PCT Pub. No.: WO2016/197692
PCT Pub. Date: Dec. 15, 2016

(65) Prior Publication Data
US 2017/0153511 A1 Jun. 1, 2017

(30) Foreign Application Priority Data
Jun. 11, 2015 (CN) .......................... 2015 1 0320741

(51) Int. Cl.
*H01L 29/04* (2006.01)
*G02F 1/1343* (2006.01)
(Continued)

(52) U.S. Cl.
CPC ...... *G02F 1/134309* (2013.01); *G02F 1/1368* (2013.01); *G02F 1/13439* (2013.01);
(Continued)

(58) Field of Classification Search
CPC ............ H01L 29/7863; H01L 27/3248; G02F 1/134309; G02F 1/134318; G02F 1/13439; G02F 1/133512; G02F 1/136286
(Continued)

(56) References Cited

U.S. PATENT DOCUMENTS

2002/0118330 A1* 8/2002 Lee .................... G02F 1/136209
349/141
2009/0065767 A1* 3/2009 Reynolds ............ H01L 27/3262
257/40
(Continued)

FOREIGN PATENT DOCUMENTS

| CN | 101697054 A | 4/2010 |
| CN | 103309099 A | 9/2013 |

(Continued)

OTHER PUBLICATIONS

International Search Report and Written Opinion dated Jul. 6, 2016; PCT/CN2016/079035.
(Continued)

Primary Examiner — Kevin M Picardat
(74) Attorney, Agent, or Firm — Ladas & Parry LLP

(57) ABSTRACT

An array substrate, a manufacturing method thereof and a display device are disclosed. The array substrate includes: a base substrate; a plurality of gate lines and a plurality of data lines disposed on the base substrate and configured to define a plurality of pixel regions; pixel electrodes and common electrodes disposed in each pixel region and arranged in different layers; and shielding electrodes being at least formed in regions corresponding to the data lines on the base substrate, being arranged in different layers from the common electrodes, and being not electrically connected with the pixel electrodes and the common electrodes.

17 Claims, 3 Drawing Sheets

(51) Int. Cl.
*H01L 21/77* (2017.01)
*H01L 27/12* (2006.01)
*G02F 1/1335* (2006.01)
*G02F 1/1362* (2006.01)
*G02F 1/1368* (2006.01)

(52) U.S. Cl.
CPC .. *G02F 1/133512* (2013.01); *G02F 1/136227* (2013.01); *G02F 1/136286* (2013.01); *H01L 21/77* (2013.01); *H01L 27/12* (2013.01); *G02F 2001/136218* (2013.01); *G02F 2001/136295* (2013.01); *G02F 2201/121* (2013.01); *G02F 2201/123* (2013.01)

(58) Field of Classification Search
USPC .......................................................... 257/72
See application file for complete search history.

(56) References Cited

U.S. PATENT DOCUMENTS

| | | | |
|---|---|---|---|
| 2009/0109363 A1 | 4/2009 | Yu et al. | |
| 2009/0167975 A1* | 7/2009 | Lee | G02F 1/13458 349/43 |
| 2010/0123845 A1* | 5/2010 | Kim | H01L 27/124 349/46 |
| 2010/0315569 A1 | 12/2010 | Lin et al. | |
| 2013/0234143 A1* | 9/2013 | Hwang | G02F 1/1362 257/57 |
| 2015/0364500 A1* | 12/2015 | Cheng | H01L 27/124 257/59 |
| 2016/0011466 A1 | 1/2016 | Choi | |
| 2016/0056177 A1* | 2/2016 | Li | H01L 27/124 257/72 |
| 2016/0109773 A1* | 4/2016 | Lee | G02F 1/136286 349/138 |
| 2016/0195745 A1 | 7/2016 | Xu | |
| 2016/0291430 A1* | 10/2016 | Sun | G02F 1/136204 |

FOREIGN PATENT DOCUMENTS

| | | |
|---|---|---|
| CN | 103676374 A | 3/2014 |
| CN | 103676376 A | 3/2014 |
| CN | 104199210 A | 12/2014 |
| CN | 104238207 A | 12/2014 |
| CN | 104516167 A | 4/2015 |
| CN | 104656324 A | 5/2015 |
| CN | 104916648 A | 9/2015 |

OTHER PUBLICATIONS

The Second Chinese Office Action dated Sep. 26, 2017; Appln. No. 201510320741.2.
The First Chinese Office Action dated Jun. 2, 2017; Appln. No. 201510320741.2.

* cited by examiner

ARRAY SUBSTRATE, MANUFACTURING METHOD THEREOF AND DISPLAY DEVICE

TECHNICAL FIELD

Embodiments of the present disclosure relate to an array substrate, a manufacturing method thereof and a display device.

BACKGROUND

In an array substrate, instantaneous electromagnetic signals produced by the change of the voltage of data lines over time generally affect the stability of the voltages of pixel electrodes and common electrodes. That is to say, the electric fields generated by the data lines produce crosstalk on the pixel electrodes and the common electrodes, so that the voltage difference between the pixel electrodes and the common electrodes can be affected, and hence the display quality of the array substrate can be affected.

SUMMARY

Embodiments of the present disclosure provide an array substrate, a manufacturing method thereof and a display device, which can solve the problem that the voltage of common electrodes can be instable as the common electrodes are susceptible to the crosstalk of data lines and hence the image quality of the entire array substrate can be affected.

A first aspect of the disclosure provides an array substrate, comprising: a base substrate; a plurality of gate lines and a plurality of data lines disposed on the base substrate and configured to define a plurality of pixel regions; pixel electrodes and common electrodes disposed in each pixel region and arranged in different layers; and shielding electrodes at least formed in regions corresponding to the data lines on the base substrate, arranged in different layers from the common electrodes, and not electrically connected with the pixel electrodes and the common electrodes.

A second aspect of the disclosure provides a display device comprising the above array substrate.

A third aspect of the disclosure provides a method for manufacturing an array substrate, comprising: forming first conductive layer patterns on a base substrate, in which the first conductive layer patterns include common electrodes disposed in pixel regions; forming an insulating layer for covering the first conductive layer patterns; and forming second conductive layer patterns on the insulating layer, in which the second conductive layer patterns include pixel electrodes and shielding electrodes which are not electrically connected, the pixel electrodes are disposed in the pixel regions, and the shielding electrodes are at least formed in regions corresponding to data lines on the base substrate and are not electrically connected with the common electrodes.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

It should be understood in the description of the embodiments of the present disclosure that: the orientation or position relationships indicated by the terms "on", "beneath", "in" and the like are based on the orientation or position relationships as shown in the accompanying drawings, are only used for the convenient description of the embodiments of the present disclosure and the simplified description, do not indicate or imply that the referred device or element must have a specific orientation and be constructed and operated in a specific orientation, and hence cannot be construed as the limitation of the embodiments of the present disclosure.

It should be noted that in all the embodiments of the present disclosure, the phrase "being arranged in the same layer" or the like refers to the situation that: at least two patterns are disposed on the same surface; and the phrase "being arranged in different layers" refers to the situation that: two patterns are disposed on different surfaces, and generally, another layer(s) is spaced between these two patterns.

Figure 1:
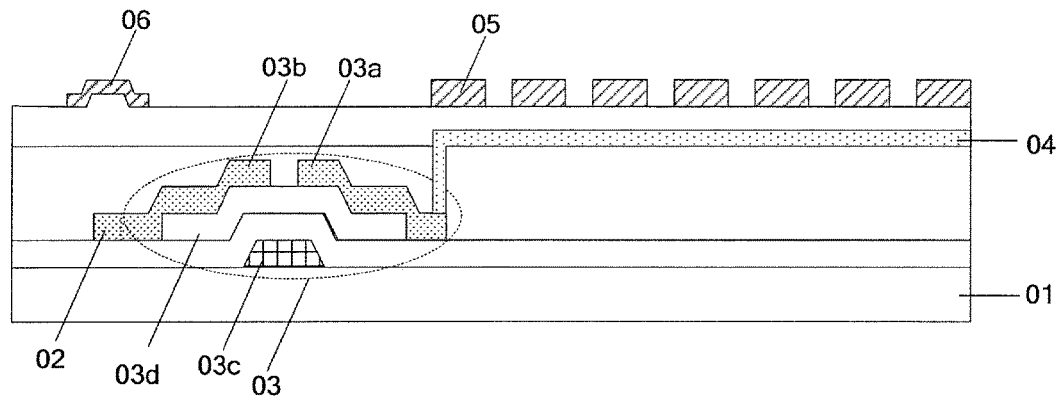
FIG. 1 is a schematic structural sectional view of an array substrate.

In order to reduce the problem of image quality caused by the crosstalk of data lines as much as possible, shielding electrodes disposed in regions corresponding to data lines are adopted to shield the crosstalk of the data lines. As illustrated in FIG. 1, the array substrate may comprise a base substrate 01, data lines 02 disposed on the base substrate 01, thin-film transistors (TFTs) 03, pixel electrodes 04 connected with drain electrodes 03a of the TFTs 03, common electrodes 05 arranged opposite to the pixel electrodes 04, and shielding electrodes 06 arranged corresponding to the data lines 02; the shielding electrodes 06 and the common electrodes 05 are arranged in the same layer and electrically connected with each other.

In the array substrate having the structure as shown in FIG. 1, when the voltage of the shielding electrode becomes instable due to the influence of the electric field formed by the data line on the voltage of the shielding electrode, as the shielding electrode is electrically connected with the common electrode, the voltage of the common electrode will also be changed along with the change of the shielding electrode, and hence the voltage of the common electrode of the entire array substrate can become instable. Thus, the voltage difference between the pixel electrode and the common electrode will change, and in this way the image quality of the entire array substrate can be affected.

First Embodiment

Figure 2:
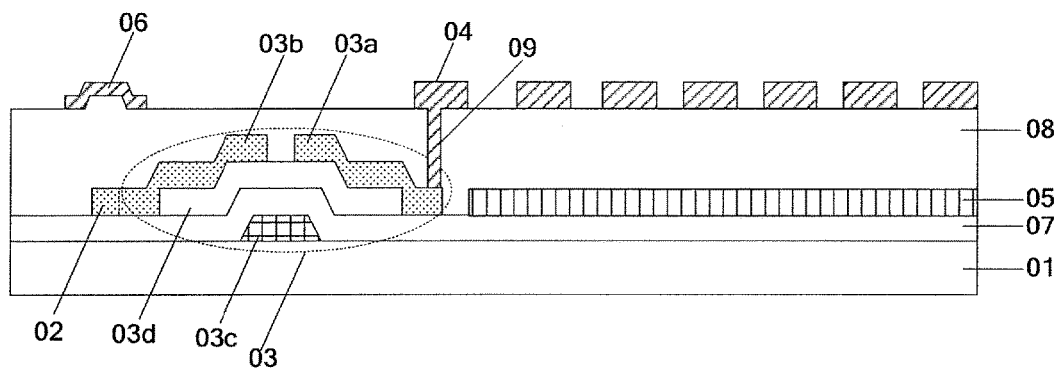
FIG. 2 is a schematic structural sectional view of an array substrate provided by an embodiment of the present disclosure.

The embodiment of the present disclosure provides an array substrate, which, as shown in FIG. 2, comprises a base substrate 01 and a plurality of gate lines and a plurality of data lines 02 disposed on the base substrate and configured to define pixel regions, and further comprises: pixel electrodes 04 and common electrodes 05 disposed in the pixel regions and arranged in different layers; and shielding electrodes 06 which are at least formed in regions corresponding to the data lines 02 on the base substrate 01, arranged in different layers from the common electrodes 05, and not electrically connected with the common electrodes 05.

It should be noted that the foregoing only illustrates the structure for solving the problem that the voltage of the common voltage becomes instable because the common electrodes are susceptible to the crosstalk produced by the data lines so that the image quality of the entire array substrate can be affected. However, it should be understood by those skilled in the art that the structure of the array substrate is not limited thereto. For instance, in an array substrate as shown in FIG. 2, the array substrate may further comprise: TFTs 03 disposed on the base substrate 01, a gate insulating layer 07 and an insulating layer 08, wherein each of the TFTs 03 includes a drain electrode 03a, a source electrode 03b, a gate electrode 03c and an active layer 03d disposed on the base substrate 01. The pixel electrodes 04 are electrically connected with the drain electrodes 03a via through holes 09; the data lines 02 are arranged in the same layer as the drain electrodes 03a and the source electrodes 03b and electrically connected with the source electrodes 03b; the common electrodes 05 are arranged opposite to the pixel electrodes 04; and the gate lines (not marked in FIG. 2) are arranged in the same layer and electrically connected as the gate electrodes 03c.

Of course, the structures incorporated in FIG. 2 are also only drawn for more clear description of the proposal of the embodiment of the present disclosure and should not be construed as the limitation of the scope of protection of the embodiment of the present disclosure.

The array substrate provided by the embodiment of the present disclosure may be an array substrate in an advanced super dimension switch (ADS) display device. In the ADS array substrate, the common electrodes and the pixel electrodes are arranged on the same base substrate. Moreover, one electrode is a plate-shaped electrode, and the other electrode is a comb-shaped electrode or an electrode with slits.

As for an ADS array substrate, the phrase that pixel electrodes and common electrodes are arranged in different layers means that: the pixel electrodes and the common electrodes are disposed on different surfaces. Illustratively, as illustrated in FIG. 2, the common electrodes 05 are disposed on the gate insulating layer 07, and the pixel electrodes 04 are disposed on the insulating layer 08. The pixel electrodes 04 and the common electrodes 05 are not electrically connected. The insulating layer 08 is spaced between the pixel electrodes 04 and the common electrodes 05 in FIG. 2. The insulating layer 08 may be made from an insulating material such as silicon oxide, silicon nitride or an organic material. In general, the insulating layer 08 may be referred to as a passivation layer.

The electrodes closer to the base substrate between the pixel electrodes 04 and the common electrodes 05 are plate-like, while the electrodes further away from the base substrate are comb-shaped electrodes or electrodes with slits. As illustrated in FIG. 2, the common electrodes closer to the base substrate and disposed on the gate insulating layer are plate-shaped electrodes, and the pixel electrodes further away from the base substrate and disposed on the insulating layer are comb-shaped electrodes.

The phrase "being not electrically connected" refers to that: at least two conductive patterns are not electrically connected.

The situation that the shielding electrodes are at least formed in the regions corresponding to the data lines on the base substrate comprises that regions of the orthographic projections of the data lines on the base substrate are overlapped with regions of the orthographic projections of the shielding electrodes on the base substrate.

In the array substrate, as the shielding electrodes at least formed in the regions corresponding to the data lines on the base substrate and the common electrodes in the array substrate are not electrically connected, when the voltages of the shielding electrodes becomes instable due to the crosstalk of the data lines on the shielding electrodes, the voltage of the common electrodes will not change along with the changes of the voltage of the shielding electrodes. Thus, as different from the case that the voltage of the common electrodes electrically connected with the shielding electrodes will change along with the voltage of the shielding electrodes, the embodiment can solve the problem that the voltage of the common electrodes becomes instable as the common electrodes are susceptible to the crosstalk of the data lines and hence the image quality of the entire array substrate can be affected.

It should be noted that: on the basis that the shielding electrodes are not electrically connected with the common electrodes, if the shielding electrodes and the common electrodes which are not electrically connected are arranged in the same layer, in order to ensure the aperture ratio, the spacing between the common electrodes and the shielding electrodes is generally very small, so that the common electrodes and the shielding electrodes is possible to be electrically connected with each other due to a contact by accident. Thus, as the common electrodes are susceptible to the crosstalk of the data lines, the voltage can become instable, and image quality of the entire array substrate can be affected. In the embodiment of the present disclosure, as the shielding electrodes and the common electrodes which are not electrically connected are arranged in different layers, the problem of the contact by accident in the case of the electrodes are arranged in the same layer can be avoided. Thus, the stability of the common voltage can be guaranteed, and hence the display quality of the array substrate can be improved.

Optionally, although the shielding electrodes and the common electrodes are not electrically connected, in order to avoid the phenomenon of light leakage, the voltage signal having the same voltage as the voltage of the common electrodes are usually applied to the shielding electrodes.

In the array substrate provided by the embodiment of the present disclosure, the shielding electrodes and the pixel electrodes may be arranged in the same layer.

The description that the shielding electrodes and the pixel electrodes are arranged in the same layer means that: the shielding electrodes and the pixel electrodes are disposed on the same surface. Illustratively, as illustrated in FIG. 2, both the shielding electrodes 06 and the pixel electrodes 04 are disposed on the insulating layer 08. As the shielding electrodes 06 and the pixel electrodes 04 which are arranged in the same layer and are both electrodes may be made from a same material, e.g., may be made from a transparent conductive material such as indium tin oxide (ITO), the shielding electrodes 06 and the pixel electrodes 04 may be formed by a single patterning process. Illustratively, different patterns may be obtained by one patterning process on the same transparent conductive layer and include the shielding electrodes and the pixel electrodes, so that the structure and the manufacturing process of the array substrate can be simplified. Of course, the shielding electrodes 06 and the pixel electrodes 04 may also be arranged in the same layer and made from different materials. No limitation will be given here.

It should be noted that: in order to ensure the coverage area and aperture ratio of the pixel electrodes, the spacing between the shielding electrodes and the pixel electrodes also cannot be too large, so that the phenomenon of electrical connection between the shielding electrodes and the pixel electrodes due to contact by accident may also occur. At this point, due to the influence of the crosstalk of the data lines, the voltages of the pixel electrodes electrically connected with the shielding electrodes will also change along with the changes of the shielding voltages, and hence the image quality of pixel units can be affected. However, compared with the case that the image quality of the entire array substrate is affected by contact by accident when the shielding electrodes and the common electrodes which are not electrically connected are arranged in the same layer, the case that the shielding electrodes and the pixel electrodes are arranged in the same layer can better ensure the image quality of the array substrate compared with the case that the shielding electrodes and the common electrodes are arranged in the same layer, and hence is more preferable structural design.

In the embodiment of the present disclosure, optionally, the common electrodes and the data lines may be arranged in the same layer. Illustratively, as illustrated in FIG. 2, both the common electrodes 05 and the data lines 02 are disposed on the gate insulating layer. Thus, although the data lines are generally made from a metallic material such as aluminum (Al), molybdenum (Mo), chromium (Cr), copper (Cu) or titanium (Ti), and the common electrodes are generally made from a material such as ITO, namely the common electrodes and the data lines are generally made from different materials and hence cannot be formed in same one patterning process, the case that the common electrodes and the data lines are arranged in the same layer can reduce the process of forming an insulating spacer layer interposed between the common electrodes and the data lines when they are arranged in different layers, so that the structure and the manufacturing process of the array substrate can be simplified. Moreover, due to the remove of the arrangement of the insulating layer between the common electrodes and the data lines, the entire array substrate will be thinner compared with the state of art, which is favorable for the light and thin design of display devices. Of course, in the array substrate, the case that the common electrodes and the data lines are arranged in different layers should also fall within the scope of protection of the embodiment of the present disclosure.

In addition, as the shielding electrodes and the pixel electrodes are arranged in the same layer and also the common electrodes and the data lines are arranged in the same layer, the spacing between the pixel electrodes and the data lines may also be increased and the coupling capacitance between the pixel electrodes and the data lines can be reduced, and hence the influence of the coupling capacitance on the voltage of the pixel electrodes and the display quality can be reduced.

Moreover, in the array substrate provided by the embodiment of the present disclosure, the source electrodes, the drain electrodes and the data lines may also be arranged in the same layer as the common electrodes.

Illustratively, in the array substrate, the width of the shielding electrodes may be greater than that of the data lines, namely regions of the orthographic projections of the shielding electrodes on the base substrate may be greater than regions of the orthographic projections of the data lines on the base substrate, so that the shielding electrodes can better shield the electric fields formed by the data lines, and hence the crosstalk of the data lines can be reduced. Of course, the width of the shielding electrodes may also be equal to that of the data lines or slightly less than that of the data lines, only with the result that the shielding effect of the shielding electrodes on the electric fields formed by the data lines is slightly poor compared with the above cases.

Moreover, in the array substrate, the shielding electrodes may also be formed in regions corresponding to the gate lines on the base substrate, namely regions of the orthographic projections of the gate lines on the base substrate are overlapped with regions of the orthographic projections of the shielding electrodes on the base substrate. For instance, the boundary of the orthographic projection of the gate line on the base substrate is disposed within the boundary of the orthographic projection of the shielding electrode on the base substrate, and of course, boundaries thereof may be partially overlapped. When the shielding electrodes are formed in the regions corresponding to the gate lines on the base substrate, the interference of instantaneous electromagnetic signals, produced by the change of voltage signals of the gate lines over the time, on the voltage of the pixel electrodes and the common electrodes can also be shielded. Moreover, the regions provided with the orthographic projections of the shielding electrodes on the base substrate may be greater than regions of orthographic projections of the data lines and the gate lines as a whole on the base substrate, namely the boundary of the orthographic projection of the data line and the gate line as a whole on the base substrate is disposed within the boundary of the orthographic projection of the shielding electrode on the base substrate, or boundaries thereof are partially overlapped, so that the interference of the electric fields formed by the data lines and the gate lines on other wirings, e.g., the common electrodes and the pixel electrodes, on the array substrate can also be shielded.

The embodiment of the present disclosure provides an array substrate. As the shielding electrodes at least formed in the regions corresponding to the data lines on the base substrate and the common electrodes in the array substrate are not electrically connected, when the voltages of the shielding electrodes becomes instable due to the crosstalk of the data lines on the shielding electrodes, the voltage of the common electrodes will not change along with the change of the voltages of the shielding electrodes. Therefore, as different from the case that the voltage of the common electrodes electrically connected with the shielding electrodes will change along with the change of the voltage of the shielding electrodes, the embodiment can solve the problem that the voltage of the common electrodes becomes instable as the common electrodes are susceptible to the crosstalk of the data lines and hence the image quality of the entire array substrate can be affected.

Second Embodiment

Figure 3:
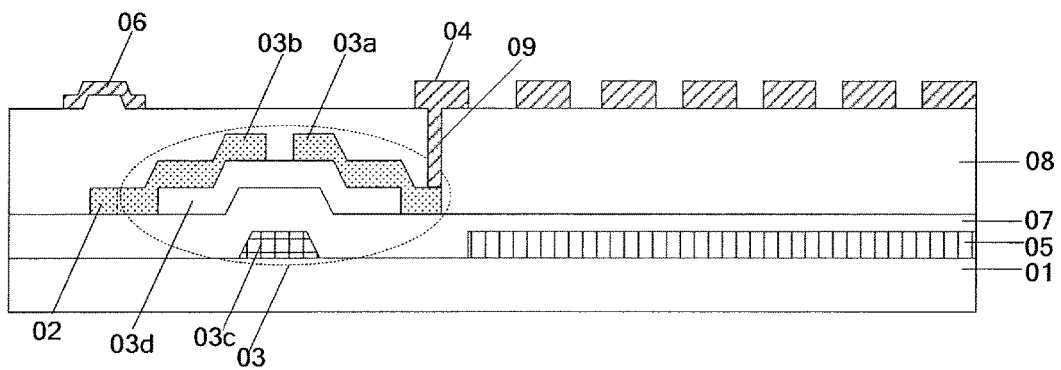
FIG. 3 is a schematic structural sectional view of another array substrate provided by an embodiment of the present disclosure.

The embodiment of the present disclosure provides an array substrate, which, as illustrated in FIG. 3, comprises a base substrate 01 and a plurality of gate lines and a plurality of data lines 02 disposed on the base substrate and configured to define pixel regions, and further comprises: pixel electrodes 04 and common electrodes 05 disposed in the pixel regions and arranged in different layers; and shielding electrodes 06 which are at least formed in regions corresponding to the data lines 02 on the base substrate 01, arranged in different layers from the common electrodes 05, and not electrically connected with the common electrodes 05.

The foregoing only illustrates the structure for solving the problem that "the voltage of the common voltage becomes instable as the common electrodes are susceptible to the crosstalk of the data lines and hence the image quality of the entire array substrate can be affected." However, it should be understood by those skilled in the art that the structure of the array substrate is not limited thereto. For instance, in the array substrate as shown in FIG. 3, the array substrate may further comprise: TFTs 03 disposed on the base substrate 01, a gate insulating layer 07 and an insulating layer 08; the TFTs 03 include drain electrodes 03a, source electrodes 03b, gate electrodes 03c and active layers 03d disposed on the base substrate 01. The pixel electrodes 04 are electrically connected with the drain electrodes 03a; the data lines 02 are arranged in the same layer as the drain electrodes 03a and the source electrodes 03b and electrically connected with the source electrodes 03b; the common electrodes 05 are arranged opposite to the pixel electrodes 04; and gate lines (not marked in FIG. 3) and the gate electrodes 03c are arranged in the same layer and electrically connected with each other.

Of course, the structures added in FIG. 3 are also only drawn for more clear description of the proposal of the embodiment of the present disclosure and should not be construed as the limitation of the scope of protection of the embodiment of the present disclosure.

Optionally, in the array substrate provided by the embodiment of the present disclosure, the shielding electrodes and the pixel electrodes may be arranged in the same layer.

It should be noted that the embodiment of the present disclosure mainly provides detailed description on those different from the first embodiment. The explanation of those the same as the first embodiment may refer to the specific description in the first embodiment. No further description will be given here.

Optionally, the array substrate provided by the embodiment of the present disclosure may further comprise common electrode lines (not marked in FIG. 3). The common electrodes and the common electrode lines are arranged in the same layer. Moreover, the common electrode lines are electrically connected with the common electrodes. In the embodiment of the present disclosure, the common electrodes and the common electrode lines are arranged in the same layer, namely the common electrodes and the common electrode lines are disposed on the same surface. For instance, both the common electrodes and the common electrode lines may be disposed on the base substrate and make direct contact with the base substrate. Voltage required for normal operation must be provided to the common electrodes via the common electrode lines, so the common electrodes must be electrically connected with the common electrode lines. In the embodiment of the present disclosure, as the common electrodes and the common electrode lines are arranged in the same layer, the common electrodes and the common electrode lines are not required to be connected via through holes, so the process of forming the through holes can be reduced, and meanwhile, the structure of the array substrate can be simplified.

When the common electrodes and the common electrode lines are arranged in the same layer, illustratively, the common electrodes are generally made from a material such as ITO and the common electrode lines are generally made from a metallic material such as Al, Mo, Cr, Cu or Ti. That is to say, the common electrodes and the common electrode lines are generally made from different materials and are generally not formed in the same patterning process. However, as similar to the design in the first embodiment that the common electrodes and the data lines are arranged in the same layer, the case that the common electrodes and the common electrode lines are arranged in the same layer can also simplify the structure and the manufacturing process of the array substrate and hence is favorable for the light and thin design of display devices. Of course, in the array substrate, the case that the common electrodes and the common electrode lines are arranged in different layers should also fall within the scope of protection of the embodiment of the present disclosure.

Optionally, in the embodiment of the present disclosure, the common electrodes and the common electrode lines arranged in the same layer may be connected with each other through metal wires. In this case, the metal wires are arranged in the same layer as the common electrodes and the common electrode lines. Illustratively, the metal wires may be made from a same material as the common electrode lines and formed together with the common electrode lines. Of course, the common electrodes and the common electrode lines arranged in the same layer may also be connected with each other by other means. The connection through the metal wires is only one example.

It should be noted that: in actual production application, corresponding to large-sized display products (e.g., TVs) and small-sized display products (e.g., mobile phones), the array substrates also include large-sized and small-sized array substrates. Compared with the small-sized array substrate, the large-sized array substrate has large resistance. The case that the common electrodes and the common electrode lines in the array substrate are connected with each other via the through holes cannot ensure the stability of the voltage of the common electrodes. Thus, the common electrodes are generally connected with the common electrode lines through the metal wires to ensure the stability of the voltage of the common electrodes, so the large-sized array substrate generally adopts the structure as shown in FIG. 3.

Moreover, in the array substrate provided by the embodiment of the present disclosure, the common electrodes, the common electrode lines, the gate lines and the gate electrodes may be arranged in the same layer. As similar to the case in the first embodiment that the common electrodes and the data lines are arranged in the same layer, the structure and the manufacturing process of the array substrate can be simplified, which is favorable for the light and thin design of display devices.

In addition, when the array substrate includes the metal wires, the metal wires may also be arranged in the same layer as the common electrodes, the common electrode lines, the gate lines and the gate electrodes.

Figure 4:
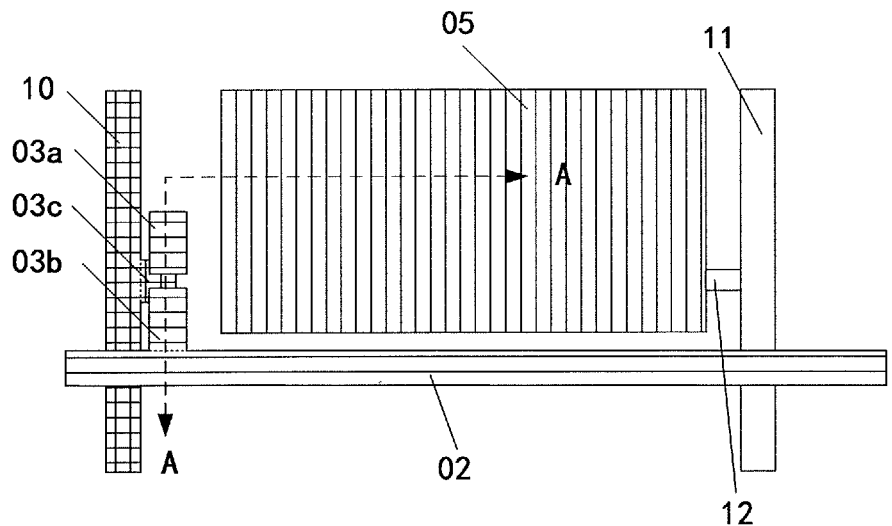
FIG. 4 is a structural partial top view of the array substrate provided by an embodiment of the present disclosure.

Illustratively, the structural partial top view of the array substrate provided by the embodiment of the present disclosure indicates the relative positions of the gate electrodes 03c, gate lines 10, common electrode lines 11, metal wires 12 and the common electrodes 05; the schematic diagram may refer to FIG. 4; and the gate electrodes 03c and the common electrodes 05 as shown in FIGS. 2 and 3 are sectional views obtained along the A-A direction of FIG. 4. In addition, other structures such as pixel electrodes are not drawn in FIG. 4.

The embodiment of the present disclosure provides an array substrate. As the shielding electrodes at least formed in the regions corresponding to the data lines on the base substrate and the common electrodes are not electrically connected in the array substrate, when the voltage of the shielding electrodes becomes instable due to the crosstalk of the data lines on the shielding electrodes, the voltage of the common electrodes will not change along with the change of the voltage of the shielding electrodes. Thus, as different from the case that the voltage of the common electrodes electrically connected with the shielding electrodes will change along with the voltage of the shielding electrodes, the embodiment can solve the problem that the voltage of the common electrodes becomes instable as the common electrodes are susceptible to the crosstalk of the data lines and hence the image quality of the entire array substrate can be affected.

The embodiment of the present disclosure further provides a display device, which comprises the array substrate provided by the first embodiment and the second embodiment.

The display device may be a display element such as a liquid crystal display (LCD), e-paper and an organic light-emitting diode (OLED) display or any product or component comprising the display element and having display function such as a TV, a digital camera, a mobile phone and a tablet PC. The specific implementation of the array substrate may refer to the description on the array substrate. No further description will be given here.

In the display device, as the shielding electrodes at least formed in the regions corresponding to the data lines on the base substrate and the common electrodes are not electrically connected in the array substrate, when the voltage of the shielding electrodes becomes instable due to the crosstalk of the data lines on the shielding electrodes, the voltage of the common electrodes will not change along with the change of the voltage of the shielding electrodes. Thus, as different from the case that the voltage of the common electrodes electrically connected with the shielding electrodes will change along with the voltage of the shielding electrodes, the embodiment can solve the problem that the voltage of the common electrodes becomes instable as the common electrodes are susceptible to the crosstalk of the data lines and hence the image quality of the entire array substrate can be affected.

Third Embodiment

Figure 5:
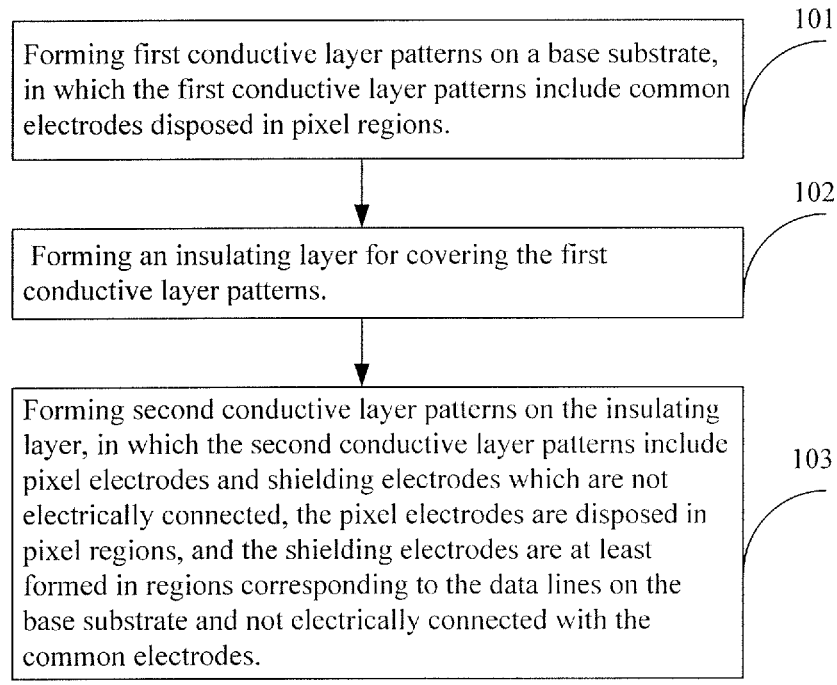
FIG. 5 is a flowchart of a method for manufacturing an array substrate provided by an embodiment of the present disclosure.

The embodiment of the present disclosure provides a method for manufacturing the array substrate provided by the first embodiment. As illustrated in FIG. 5, the method mainly comprises the following operations.

S101: forming first conductive layer patterns on a base substrate, in which the first conductive layer patterns include common electrodes disposed in pixel regions.

The base substrate may be made from a material such as a glass plate from Corning, a glass plate from Asahi, or a quartz glass. The first conductive layer patterns are generally formed by a patterning process. The patterning process may include: processes such as film forming, exposure and development, and of course, may further include processes such as etching and stripping. In the embodiment of the present disclosure, the patterning process is not limited thereto. The process shall all fall within the scope of protection of the embodiment of the present disclosure as long as the first conductive layer patterns can be formed on the base substrate.

Optionally, in the step S101, the first conductive layer patterns may further include data lines, source electrodes and drain electrodes arranged in the same layer as the common electrodes; the common electrodes are generally made from a transparent conductive material, and the data lines, the source electrodes and the drain electrodes are generally made from a same metallic material. At this point, the step S101 may adopt any of the following ways.

First method. The step S101 may be conducted by one mask patterning process and may include: forming a first conductive layer on the base substrate, in which the first conductive layer includes a transparent conductive film and a metallic film formed in sequence; and subsequently, forming photoresist on the first conductive layer, performing processes such as exposure via a half-tone or gray-scale mask, developing, and etching on the first conductive layer, and obtaining the first conductive layer patterns. The data lines, the source electrodes and the drain electrodes that are formed in this way may include two layers. One layer includes transparent conductive patterns closer to the base substrate, and the other layer includes metallic patterns disposed on the transparent conductive patterns. The transparent conductive film may be made from a material such as ITO, and the metallic film may be made from a material such as Al, Mo, Cr, Cu or Ti.

Second method. The step S101 may be conducted by two mask patterning processes and may include: (1) forming a transparent conductive film on the base substrate, and subsequently, obtaining patterns of the common electrodes by photoresist coating, exposing with a mask, developing, and etching, wherein the formed patterns of the common electrodes have photoresist which is not removed thereon; and (2) forming a metallic film on the base substrate provided with the common electrodes, and obtaining patterns of data lines, source electrodes and drain electrodes by photoresist coating, exposing with a mask, developing and etching; and subsequently, removing the photoresist left on the patterns of the data lines, the source electrodes and the drain electrodes and stripping off the photoresist left on the patterns of the common electrodes, thus obtaining the first conductive layer patterns including the common electrodes, the data lines, the source electrodes and the drain electrodes arranged in the same layer.

It should be noted that: when the step (2) is executed, as the photoresist left on the patterns of the common electrodes in the step (1) is not removed, the photoresist can protect the common electrodes from being etched in the step (2).

In addition, in the process of forming the first conductive layer patterns by the two mask patterning processes, the applied mask may be a common mask (namely a mask only including transparent areas and opaque areas). The manufacturing cost of the mask is relatively lower than that of the half-tone or gray-scale mask, so that the cost can be reduced.

Third way. The step S101 may be conducted by two mask patterning processes and may include: (1) forming a metallic film on the base substrate, and subsequently, obtaining patterns of data lines, source electrodes and drain electrodes by photoresist coating, exposing with a mask, developing and etching, in which the patterns of the data lines, the source electrodes and the drain electrodes have photoresist which is not removed thereon; and (2) forming a transparent conductive film on the base substrate provided with the patterns of the data lines, the source electrodes and the drain electrodes, and obtaining the patterns of the common electrodes by photoresist coating, exposing with a mask, developing and etching; and subsequently, removing photoresist on the patterns of the common electrodes and stripping off the photoresist left on the patterns of the data lines, the source electrodes and the drain electrodes, and obtaining the first conductive layer patterns including the patterns of the common electrodes, the data lines, the source electrodes and the drain electrodes arranged in the same layer.

Similar to the second proposal, when the step (2) is executed, as the photoresist left on the data lines, the source electrodes and the drain electrodes in the step (1) is not removed, the photoresist can protect the data lines, the source electrodes and the drain electrodes from being etched in the step (2).

In the step, as the formed first conductive layer patterns include the common electrodes, the data lines, the source electrodes and the drain electrodes arranged in the same layer, an insulating layer required when the common electrodes are arranged in different layers from the data lines, the source electrodes and the drain electrodes can be omitted, so that the structure and the manufacturing process of the array substrate can be simplified, which is favorable for the light and thin design of display devices.

S102: forming an insulating layer for covering the first conductive layer patterns.

The insulating layer may adopt an insulating material such as silicon oxide, silicon nitride or an organic material.

S103: forming second conductive layer patterns on the insulating layer, in which the second conductive layer patterns include pixel electrodes and shielding electrodes which are not electrically connected, the pixel electrodes are disposed in pixel regions, and the shielding electrodes are at least formed in regions corresponding to the data lines on the base substrate and not electrically connected with the common electrodes.

In the step, the formed second conductive layer patterns include the pixel electrodes and the shielding electrodes which are not electrically connected, namely the pixel electrodes and the shielding electrodes are arranged in the same layer. Thus, compared with the case that the pixel electrodes and the shielding electrodes are arranged in different layers, the structure and the manufacturing process of the array substrate can be simplified. When the pixel electrodes and the shielding electrodes are arranged in the same layer, the pixel electrodes and the shielding electrodes are all electrodes which may be made from the same material, and hence can be formed by the same patterning process.

Illustratively, the schematic structural view of the array substrate manufactured by the method provided by the embodiment of the present disclosure may refer to FIG. 2. The insulating layer in the step S102 may be the insulating layer 08 in FIG. 2, and the drain electrodes 03a are connected with the pixel electrodes 04 via the through holes 09 in the insulating layer 08.

Moreover, the width of the shielding electrodes may be greater than that of the data lines, so that the signal crosstalk of the data lines can be better shielded. The shielding electrodes may also be formed in regions corresponding to gate lines on the base substrate, so as to shield the signal crosstalk of the gate lines.

In the method for manufacturing the array substrate, provided by the embodiment of the present disclosure, as the common electrodes in the first conductive layer patterns and the shielding electrodes in the second conductive layer patterns, which are respectively formed, are not electrically connected, when the voltage of the shielding electrodes becomes instable due to the crosstalk of the data lines on the shielding electrodes, the voltage of the common electrodes will not change along with the change of the voltage of the shielding electrodes. Thus, as different from the case that the common electrodes electrically connected with the shielding electrodes will change along with the voltage of the shielding electrodes, the method can solve the problem that the voltage of the common electrodes becomes instable as the common electrodes are susceptible to the crosstalk of the data lines and hence the image quality of the entire array substrate can be affected.

Fourth Embodiment

Figure 6:
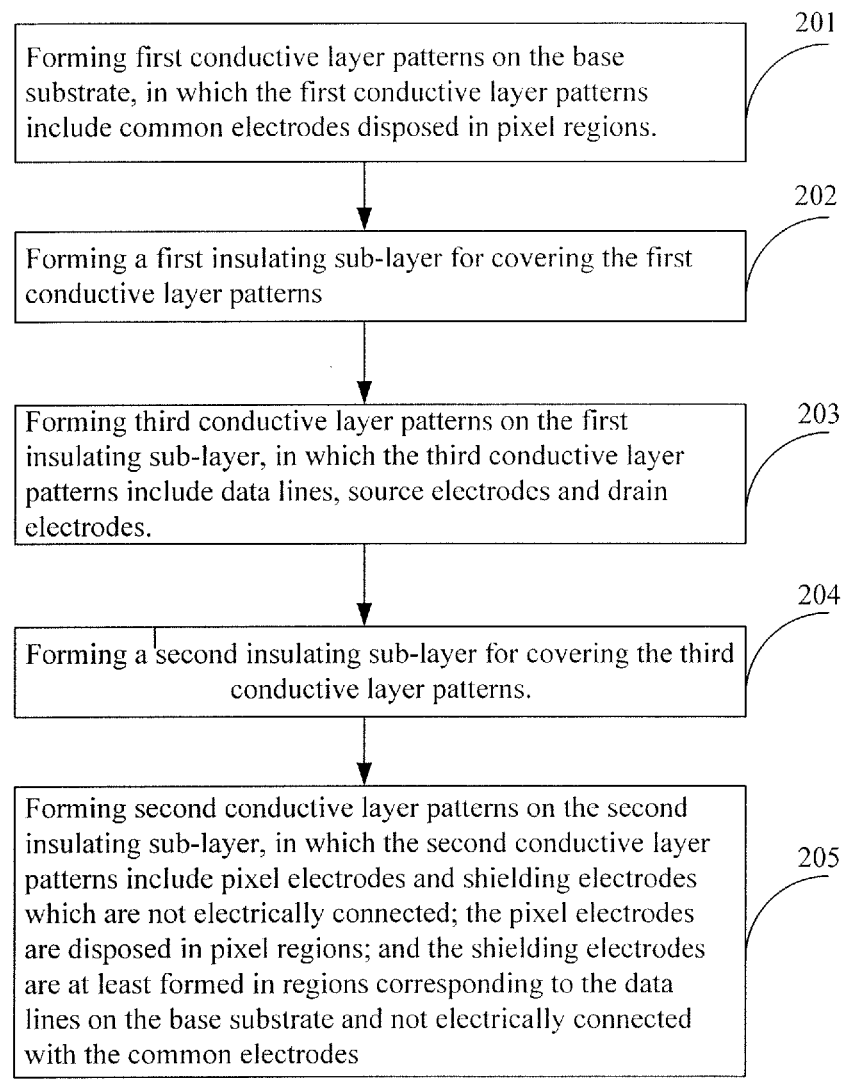
FIG. 6 is a flowchart of another method for manufacturing an array substrate provided by an embodiment of the present disclosure.

The embodiment of the present disclosure provides a method for manufacturing the array substrate provided by the second embodiment. As illustrated in FIG. 6, the method may mainly comprise the following steps.

S201: forming first conductive layer patterns on the base substrate, in which the first conductive layer patterns include common electrodes disposed in pixel regions.

Optionally, in the step S201, the first conductive layer patterns may further include common electrode lines arranged in the same layer as the common electrodes, and/or gate lines and gate electrodes, and/or metal wires for connecting the common electrodes and the common electrode lines. The common electrodes are generally made from a transparent conductive material, and the common electrode lines, the gate lines, the gate electrodes and the metal wires are generally made from the same metallic material. Taking the case that the first conductive layer patterns include the common electrodes, the common electrode lines, the gate lines, the gate electrodes and the metal wires arranged in the same layer as an example, the step S201 may adopt any one of the following ways.

First way. The step S201 may be conducted by one mask patterning process and may include: forming a first conductive layer on the base substrate, in which the first conductive layer includes a transparent conductive film and a metallic film formed in sequence; and subsequently, forming photoresist on the first conductive layer, performing processes such as exposing, developing and etching on the first conductive layer via a half-tone or gray-scale mask, and obtaining the first conductive layer patterns. It should be noted that: the common electrode lines, the gate lines, the gate electrodes and the metal wires formed in this way all include two layers. One layer includes transparent conductive patterns close to the base substrate, and the other layer includes metallic patterns disposed on the transparent conductive patterns. The transparent conductive film may be made from a material such as ITO, and the metallic film may be made from a material such as Al, Mo, Cr, Cu or Ti.

Second way. The step S201 may be conducted by two mask patterning processes and may include: (1) forming a transparent conductive film on the base substrate, and subsequently, obtaining patterns of the common electrodes by photoresist coating, exposing with a mask, developing and etching, in which the patterns of the common electrodes have photoresist which is not removed thereon; and (2) forming a metallic film on the base substrate provided with the common electrodes, and obtaining patterns of common electrode lines, gate lines, gate electrodes and metal wires by photoresist coating, exposing with a mask, developing and etching; and subsequently, removing photoresist on the patterns of the common electrode lines, the gate lines, the gate electrodes and the metal wires and stripping off photoresist the patterns of the common electrodes, and obtaining the first conductive layer patterns including the common electrodes, the common electrode lines, the gate lines, the gate electrodes and the metal wires arranged in the same layer.

It should be noted that: when the step (2) is executed, as the photoresist left on the patterns of the common electrodes in the step (1) is not removed, the photoresist can protect the common electrodes from being etched in the step (2).

In addition, in the process of forming the first conductive layer patterns by the two mask patterning processes, the used mask may be a common mask (namely a mask only including transparent areas and opaque areas). The manufacturing cost of the mask is relatively lower than that of the half-tone or gray-scale mask, so that the cost can be reduced.

Third way. The step S201 may be conducted by two mask patterning processes and may include: (1) forming a metallic film on the base substrate, and subsequently, obtaining patterns of common electrode lines, gate lines, gate electrodes and metal wires by photoresist coating, exposing with a mask, developing and etching, in which the patterns of the common electrode lines, the gate lines, the gate electrodes and the metal wires have photoresist which is not removed thereon; and (2) forming a transparent conductive film on the base substrate provided with the patterns of the common electrode lines, the gate lines, the gate electrodes and the metal wires, and obtaining the patterns of the common electrodes by photoresist coating, exposing with a mask, developing and etching; and subsequently, removing photoresist on the patterns of the common electrodes and stripping off photoresist on the patterns of the common electrode lines, the gate lines, the gate electrodes and the metal wires, and obtaining the first conductive layer patterns including the patterns of the common electrodes, the common electrode lines, the gate lines, the gate electrodes and the metal wires arranged in the same layer.

Similar to the second proposal, when the step (2) is executed, as the photoresist on the common electrode lines, the gate lines, the gate electrodes and the metal wires in the step (1) is not removed, the photoresist can protect the common electrode lines, the gate lines, the gate electrodes and the metal wires from being etched in the step (2).

In the step, the formed first conductive layer patterns include common electrodes and common electrode lines arranged in the same layer, and/or gate lines and gate electrodes, and/or metal wires for connecting the common electrodes and the common electrode lines. As the common electrodes and the common electrode lines are arranged in the same layer, the common electrodes and the common electrode lines arranged in the same layer are not required to be connected with each other via through holes, so that the structure of the array substrate can be simplified. Moreover, as the common electrodes and the common electrode lines, and/or the gate lines and the gate electrodes, and/or the metal wires for connecting the common electrodes and the common electrode lines are arranged in the same layer, an insulating layer required in the case of being arranged in different layers can be omitted, so that the structure and the manufacturing process can be further simplified, which is favorable for the light and thin design of display devices.

S202: forming a first insulating sub-layer for covering the first conductive layer patterns.

The first insulating sub-layer here mainly may be configured to insulate the first conductive layer patterns from other conductive patterns and may be made from an insulating material such as silicon oxide, silicon nitride or an organic material.

S203: forming third conductive layer patterns on the first insulating sub-layer, in which the third conductive layer patterns include data lines, source electrodes and drain electrodes.

The data lines, the source electrodes and the drain electrodes arranged in the same layer in the third conductive layer patterns may be made from the same material and hence may be formed in the same patterning process.

S204: forming a second insulating sub-layer for covering the third conductive layer patterns.

The second insulating sub-layer here may be configured to insulate the third conductive layer patterns from the second conductive layer patterns and may be made from an insulating material such as silicon oxide, silicon nitride or an organic material.

S205: forming second conductive layer patterns on the second insulating sub-layer, in which the second conductive layer patterns include pixel electrodes and shielding electrodes which are not electrically connected, the pixel electrodes are disposed in pixel regions, and the shielding electrodes are at least formed in regions corresponding to the data lines on the base substrate and not electrically connected with the common electrodes.

The common electrodes and the shielding electrodes arranged in the same layer in the second conductive layer patterns may be made from the same material and hence may be formed by the same patterning process.

Illustratively, the schematic structural view of the array substrate manufactured by the manufacturing method provided by the embodiment of the present disclosure may refer to FIG. 3, and the first insulating sub-layer may be the gate insulating layer 07 in FIG. 3; the second insulating layer sub-layer may be the insulating layer 08 in FIG. 2; and the pixel electrodes are connected with the drain electrodes 03a via the through holes 09 in the second insulating sub-layer.

In the method for manufacturing the array substrate, provided by the embodiment of the present disclosure, as the common electrodes in the first conductive layer patterns and the shielding electrodes in the second conductive layer patterns, which are respectively formed, are not electrically connected, when the voltage of the shielding electrodes becomes instable due to the crosstalk of the data lines on the shielding electrodes, the voltage of the common electrodes will not change along with the change of the voltage of the shielding electrodes. Thus, as different from the case that the common electrodes electrically connected with the shielding electrodes will change along with the voltage of the shielding electrodes, the method can solve the problem that the voltage of the common electrodes becomes instable as the common electrodes are susceptible to the crosstalk of the data lines and hence the image quality of the entire array substrate can be affected.

The foregoing is only the preferred embodiments of the present disclosure and not intended to limit the scope of protection of the present disclosure. Any change or replacement that may be easily thought of by those skilled in the art within the technical scope disclosed by the present disclosure shall fall within the scope of protection of the present disclosure. Therefore, the scope of protection of the present disclosure shall be defined by the appended claims.

The application claims priority to the Chinese patent application No. 201510320741.2, filed Jun. 11, 2015, the disclosure of which is incorporated herein by reference as part of the application.

What is claimed is:

1. An array substrate, comprising:
a base substrate;
a plurality of gate lines and a plurality of data lines disposed on the base substrate and configured to define a plurality of pixel regions;
pixel electrodes and common electrodes disposed in each pixel region and arranged in different layers; and
shielding electrodes at least formed in regions corresponding to the data lines on the base substrate, arranged in different layers from the common electrodes, and not electrically connected with the pixel electrodes and the common electrodes, wherein the shielding electrodes do not overlap the common electrodes in a direction perpendicular to the base substrate, and the shielding electrodes comprise a protrusion.

2. The array substrate according to claim 1, wherein the shielding electrodes and the pixel electrodes are arranged in a same layer.

3. The array substrate according to claim 2, wherein the common electrodes and the data lines are arranged in a same layer.

4. The array substrate according to claim 2, further comprising: common electrode lines, wherein the common electrodes and the common electrode lines are arranged in the same layer; and the common electrode lines are electrically connected with the common electrodes.

5. The array substrate according to claim 4, wherein for electrical connection between the common electrode lines and the common electrodes, the common electrode lines and the common electrodes are electrically connected with each other through metal wires.

6. The array substrate according to claim 4, wherein the common electrodes, the common electrode lines, the gate lines and gate electrodes are arranged in a same layer.

7. The array substrate according to claim 1, wherein a width of the shielding electrodes is greater than that of the data lines.

8. The array substrate according to claim 1, wherein the shielding electrodes are also formed in regions corresponding to the gate lines on the base substrate.

9. The array substrate according to claim 1, wherein a width of the shielding electrodes is equal to or less than that of the data fines.

10. A display device, comprising the array substrate according to claim 1.

11. A method for manufacturing an array substrate, comprising:
forming first conductive layer patterns on a base substrate, in which the first conductive layer patterns include common electrodes disposed in pixel regions;
forming an insulating layer for covering the first conductive layer patterns; and
forming second conductive layer patterns on the insulating layer, in which the second conductive layer patterns include pixel electrodes and shielding electrodes which are not electrically connected, the pixel electrodes are disposed in the pixel regions, the shielding electrodes are at least formed in regions corresponding to data lines on the base substrate and are not electrically connected with the common electrodes, and the shielding electrodes do not overlap the common electrodes in a direction perpendicular to the base substrate, and the shielding electrodes comprise a protrusion.

12. The manufacturing method according to claim 11, wherein the first conductive layer patterns further include the data lines, source electrodes and drain electrodes arranged in a same layer as the common electrodes.

13. The manufacturing method according to claim 11, wherein the first conductive layer patterns further include common electrode lines arranged in a same layer as the common electrodes, and/or gate lines and gate electrodes, and/or metal wires for connecting the common electrodes and the common electrode lines.

14. The manufacturing method according to claim 13, wherein forming of the insulating layer for covering the first conductive layer patterns includes: forming a first insulating sub-layer and a second insulating sub-layer for covering the first conductive layer patterns in sequence; and
after forming the first insulating sub-layer and before forming the second insulating layer, the method further comprises: forming third conductive layer patterns on the first insulating sub-layer, in which the third conductive layer patterns include the data lines, the source electrodes and the drain electrodes.

15. The array substrate according to claim 5, wherein the common electrodes, the common electrode lines, the gate lines and gate electrodes are arranged in a same layer.

16. The array substrate according to claim 1, wherein the protrusion overlaps one of the data lines in the direction perpendicular to the base substrate.

17. An array substrate, comprising:
a base substrate;
a plurality of gate lines and a plurality of data lines disposed on the base substrate and configured to define a plurality of pixel regions;
pixel electrodes and common electrodes disposed in each pixel region and arranged in different layers; and
shielding electrodes at least formed in regions corresponding to the data lines on the base substrate, arranged in different layers from the common electrodes, and not electrically connected with the pixel electrodes and the common electrodes, wherein the shielding electrodes comprises a protrusion overlapping one of the data lines in a direction perpendicular to the base substrate.

* * * * *